United States Patent
Fang et al.

(10) Patent No.: US 10,685,934 B2
(45) Date of Patent: Jun. 16, 2020

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Jen-Kuang Fang, Kaohsiung (TW); Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/645,975

(22) Filed: Jul. 10, 2017

(65) Prior Publication Data

US 2019/0013289 A1 Jan. 10, 2019

(51) Int. Cl.
*H01L 23/48* (2006.01)
*H01L 23/00* (2006.01)
(Continued)

(52) U.S. Cl.
CPC ............ *H01L 24/43* (2013.01); *H01L 21/561* (2013.01); *H01L 21/568* (2013.01); *H01L 23/3107* (2013.01); *H01L 23/3135* (2013.01); *H01L 24/06* (2013.01); *H01L 24/09* (2013.01); *H01L 24/13* (2013.01); *H01L 24/48* (2013.01); *H01L 24/73* (2013.01); *H01L 24/94* (2013.01); *H01L 2224/024* (2013.01); *H01L 2224/02311* (2013.01); *H01L 2224/02321* (2013.01); *H01L 2224/02331* (2013.01); *H01L 2224/02379* (2013.01); *H01L 2224/02381* (2013.01); *H01L 2224/04105* (2013.01); *H01L 2224/06102* (2013.01); *H01L 2224/09103* (2013.01); *H01L 2224/12105* (2013.01); *H01L 2224/13024* (2013.01); *H01L 2224/214* (2013.01); *H01L 2224/43847* (2013.01); *H01L 2224/48105* (2013.01); *H01L 2224/48139* (2013.01); *H01L 2224/73101* (2013.01);
(Continued)

(58) Field of Classification Search
CPC ......... H01L 24/43; H01L 24/94; H01L 24/13; H01L 24/48; H01L 24/06; H01L 24/09; H01L 21/568; H01L 24/73; H01L 2224/73207; H01L 2224/02381; H01L 2924/18165; H01L 2224/09103; H01L 2224/13024; H01L 2224/48105; H01L 2224/73215; H01L 2224/12105; H01L 2224/02379; H01L 2224/73101; H01L 2224/06102; H01L 2224/02331; H01L 2224/48139; H01L 2924/381; H01L 2224/04105; H01L 2224/02321
See application file for complete search history.

(56) References Cited

U.S. PATENT DOCUMENTS 6,847,122 B1   1/2005 Batish et al.
8,174,119 B2   5/2012 Pendse
(Continued)

*Primary Examiner* — Stephen M Bradley
*Assistant Examiner* — Wasiul Haider
(74) *Attorney, Agent, or Firm* — Foley & Lardner LLP

(57) ABSTRACT

A semiconductor device package includes an electronic component, a first set of conductive wires electrically connected to the electronic component, and an insulation layer surrounding the first set of conductive wires. The insulation layer exposes a portion of the first set of the conductive wires. The insulation layer is devoid of a filler.

17 Claims, 19 Drawing Sheets

(51) Int. Cl.
*H01L 21/56* (2006.01)
*H01L 23/31* (2006.01)

(52) U.S. Cl.
CPC ............ *H01L 2224/73207* (2013.01); *H01L 2224/73215* (2013.01); *H01L 2224/94* (2013.01); *H01L 2924/18162* (2013.01); *H01L 2924/18165* (2013.01); *H01L 2924/381* (2013.01)

(56) References Cited

U.S. PATENT DOCUMENTS

| | | | | |
|---|---|---|---|---|
| 2008/0131998 | A1* | 6/2008 | Takiar | H01L 24/32 438/109 |
| 2011/0195529 | A1* | 8/2011 | Wu | H01L 24/49 438/15 |
| 2013/0341739 | A1* | 12/2013 | Chang | H01L 23/051 257/417 |
| 2014/0291867 | A1* | 10/2014 | Bintang | H01L 22/14 257/777 |
| 2015/0140736 | A1* | 5/2015 | Pendse | H01L 24/19 438/109 |
| 2018/0151453 | A1* | 5/2018 | Yu | H01L 24/11 |
| 2018/0226333 | A1* | 8/2018 | Shih | H01L 24/19 |
| 2018/0337149 | A1* | 11/2018 | Lin | H01L 21/561 |

* cited by examiner

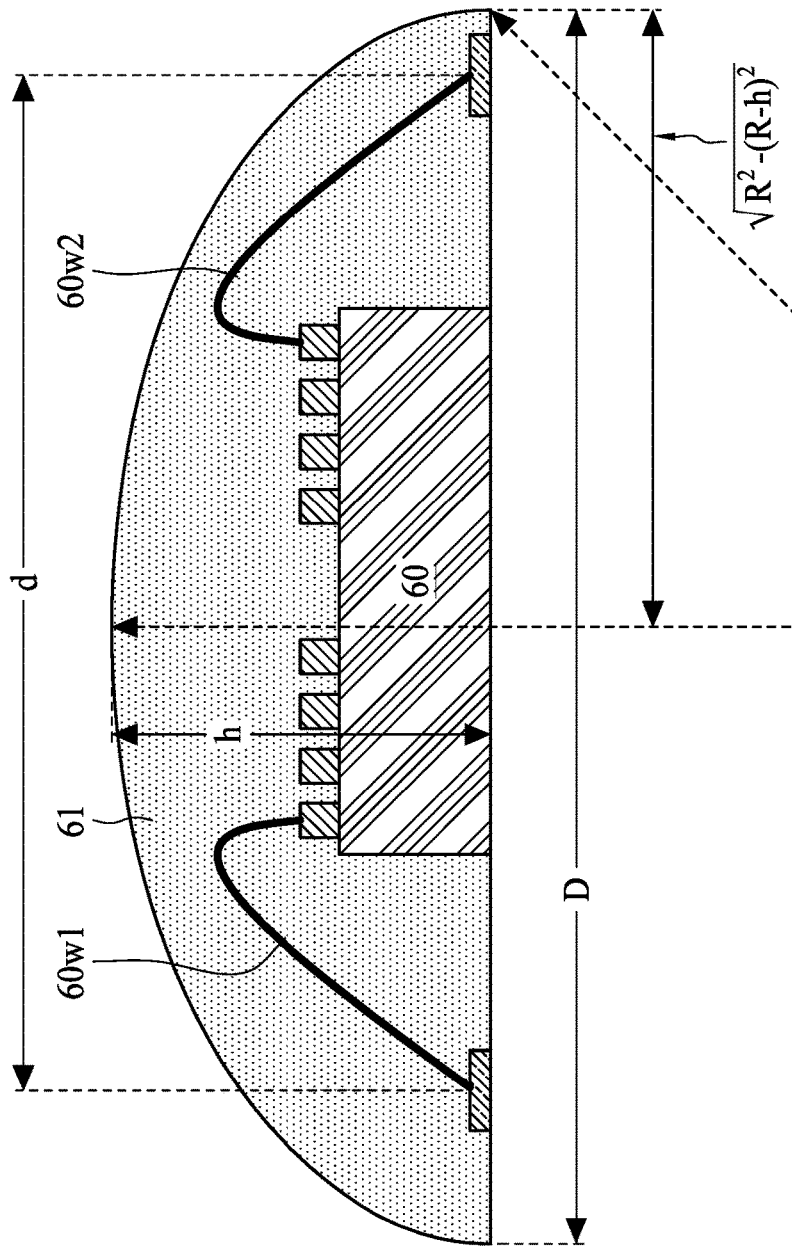

understood from the following detailed description taken in conjunction with the accompanying drawings.

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. The present disclosure relates to a semiconductor package device including a fan-out structure and a method of manufacturing the same.

2. Description of the Related Art

In a semiconductor package device, one or more semiconductor devices may be attached or mounted to a substrate by a flip-chip technique or a wire-bond technique. The flip-chip technique (e.g. which can implement conductive pillars or an interposer to provide electrical connection between the semiconductor devices and the substrate) can be used in a fine-pitch semiconductor device package (e.g. three-dimensional products, such as three-dimensional integrated circuits). However, manufacturing processes that use the flip-chip technique can be complex and expensive.

SUMMARY

In one aspect, according to some embodiments, a semiconductor device package includes an electronic component, a first set of conductive wires electrically connected to the electronic component, and an insulation layer surrounding the first set of conductive wires. The insulation layer exposes a portion of the first set of the conductive wires. The insulation layer does not include filler.

In another aspect, according to some embodiments, a semiconductor device package includes an electronic component, a first set of conductive wires electrically connected to the electronic component, an insulation layer surrounding the first set of the conductive wires, and a package body encapsulating the insulation layer. The insulation layer exposes a portion of the first set of the conductive wires. The first set of conductive wires is separated from the package body by the insulation layer.

In yet another aspect, according to some embodiments, a method of manufacturing a semiconductor device package includes providing an electronic component including a plurality of conductive contacts. The method further includes connecting two of the conductive contacts by a first conductive wire. The method yet further includes forming an insulation layer that is devoid of a filler to cover the first conductive wire.

BRIEF DESCRIPTION OF THE DRAWINGS

Aspects of the present disclosure are best understood from the following detailed description when read with the accompanying drawings. It is noted that various features may not be drawn to scale, and in the drawings the dimensions of the depicted features may be arbitrarily increased or reduced for clarity of discussion.

FIG. 6 illustrates a cross-sectional view of some embodiments a semiconductor package device in accordance with some embodiments of the present disclosure.

Common reference numerals are used throughout the drawings and the detailed description to indicate the same or similar elements. The present disclosure will be more readily understood from the following detailed description taken in conjunction with the accompanying drawings.

DETAILED DESCRIPTION

Figure 1A:
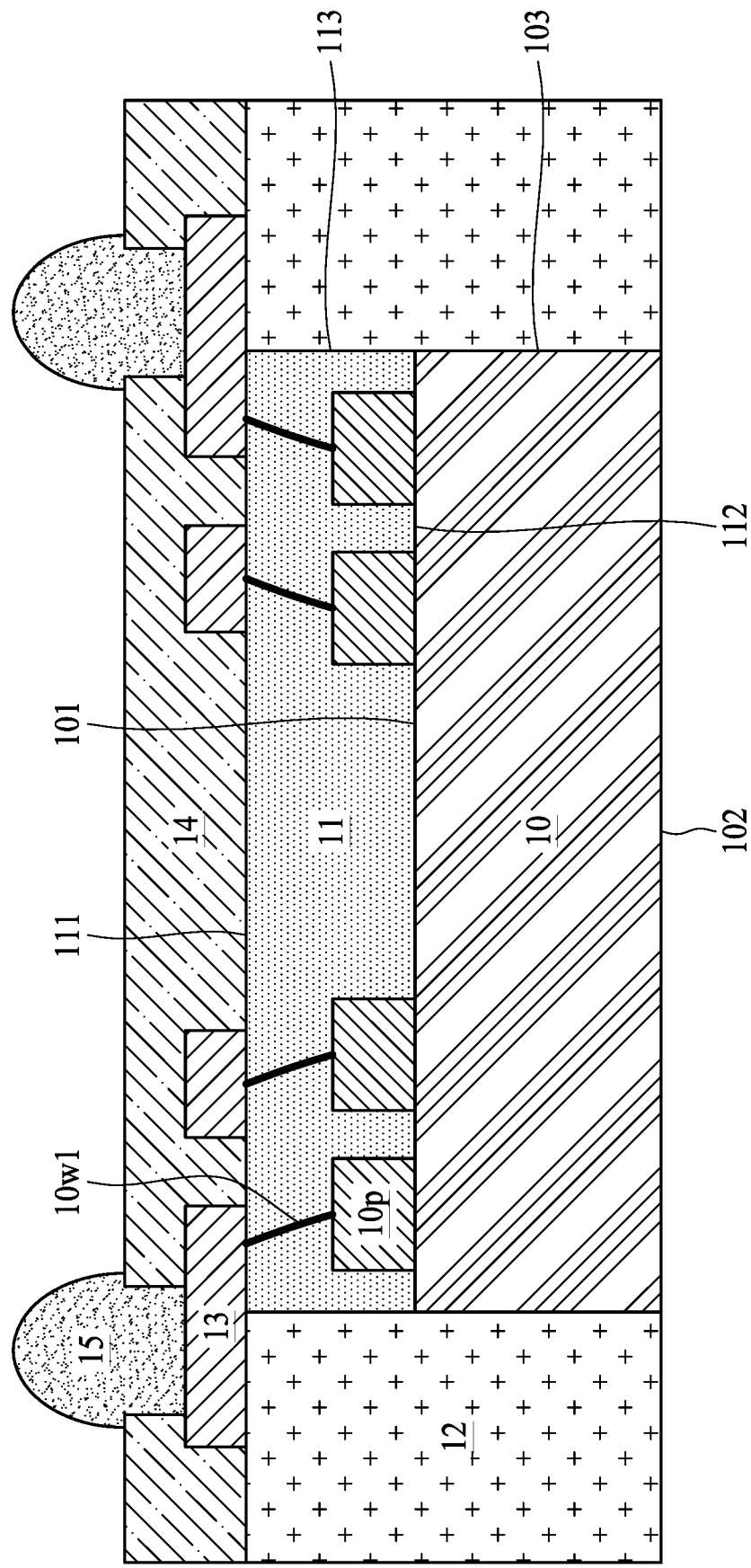
FIG. 1A illustrates a cross-sectional view of some embodiments of a semiconductor package device in accordance with a first aspect of the present disclosure.

FIG. 1A illustrates a cross-sectional view of some embodiments of a semiconductor package device 1A in accordance with a first aspect of the present disclosure. The semiconductor package device 1A includes an electronic component 10, an insulation layer 11, a package body 12, an interconnection layer 13, a protective layer 14 and electrical contacts 15.

The electronic component 10 has an active surface 101, a back surface 102 (also referred to as backside) opposite to the active surface 101 and a lateral surface 103 extending between the active surface 101 and the back surface 102. The electronic component 10 may include a chip or a die and can include a semiconductor substrate, one or more integrated circuit devices and/or one or more overlying interconnection structures therein. The integrated circuit devices may include active devices such as transistors and/or passive devices such resistors, capacitors, inductors, or a combination thereof.

A plurality of conductive wires 10w1 are respectively electrically connected to conductive contacts 10p disposed on the active surface 101 of the electronic component 10. The conductive contacts 10p can be connected to, or can constitute a part of, one or more redistribution layers (RDLs) within the electronic component 10. In some embodiments, a line width/line space L/S of an RDL that includes the conductive contacts 10p is equal to or less than about 2 micrometers (μm)/about 2 μm. In some embodiments, each of the conductive wires 10w1 is a portion of a respective bonding wire. The conductive wires 10w1 extend outwardly from the active surface 101 of the electronic component 10 to the protective layer 14. In some embodiments, the width of the conductive wires 10w1 is about 15 μm to about 25 μm. In some embodiments, the conductive wires 10w1 include gold (Au), silver (Ag), copper (Cu), platinum (Pt), titanium (Ti), tungsten (W), nickel (Ni) or other suitable metals or alloys.

The insulation layer 11 is disposed on the active surface 101 of the electronic component 10 to cover the active surface 101 of the electronic component 10 and a portion of the conductive wires 10w1. One terminal of each conductive wire 10w1 is exposed from the insulation layer 11. The insulation layer 11 has a first surface 111, a second surface 112 and a lateral surface 113 extending between the first surface 111 and the second surface 112. The second surface 112 may face the active surface 101, and the first surface 111 may be opposite to the second surface 112. In some embodiments, the insulation layer 11 includes a resin devoid of a filler such fibers or ceramic particles, such as an epoxy resin without fillers, a polyimide, a phenolic compound or material, a material with a silicone dispersed therein, or a combination thereof. By being devoid of a filler, any filler that is present is included in an amount of no greater than about 5% by weight of the insulation layer 11, such as no greater than about 3% by weight, no greater than 2% by weight, or no greater than 1% by weight. In some embodiments, the insulation layer 11 includes a potting glue or other adhesive material.

The insulation layer 11 and the conductive wires 10w1 constitute at least part of a fine-line RDL and can provide for a fan-out structure for the electronic component 10. In some embodiments, the fine-line RDL can be achieved by using an interposer or copper pillars. However, the cost for manufacturing the interposer having a fine-line structure or copper pillars can be expensive. By using bonding wires (e.g., the conductive wires 10w1) for the fine-line RDL, the manufacturing cost and time can be reduced.

The package body 12 is disposed on the lateral surface 103 of the electronic component 10 and the lateral surface 113 of the insulation layer 11. In some embodiments, the package body 12 includes an epoxy resin having fillers, a molding compound (e.g., an epoxy molding compound or other molding compound), a polyimide, a phenolic compound or material, a material with a silicone dispersed therein, or a combination thereof.

The interconnection layer 13 (which can include, for example, an RDL or other patterned conductive layer) is disposed on the first surface 111 of the insulation layer 11 and the package body 12. The interconnection layer 13 is electrically connected to the exposed portion of the conductive wires 10w1. A L/S of the interconnection layer 13 (e.g. the L/S of conductive pads of the interconnection layer 13) is larger than that of the RDL that includes the conductive contacts 10p (e.g. is larger than the L/S of the conductive contacts 10p); for example, a pitch between at least two adjacent conductive pads of the interconnection layer 13 is larger than a pitch between at least two adjacent conductive contacts 10p. In some embodiments, the L/S of the interconnection layer 13 is larger than about 7 μm/about 7 μm.

The protective layer 14 is disposed on the first surface 111 of the insulation layer 11 and the package body 12 to cover a portion of the interconnection layer 13. The protective layer 14 defines openings that expose a portion of the interconnection layer 13. In some embodiments, the protective layer 14 includes a solder resist or a solder mask.

Electrical contacts 15 are disposed within the openings of the protective layer 14 and electrically connected to the exposed portion of the interconnection layer 13. In some embodiments, electrical contacts 15 include Controlled Collapse Chip Connection (C4) bumps, solder balls or a Land Grid Array (LGA).

Figure 1B:
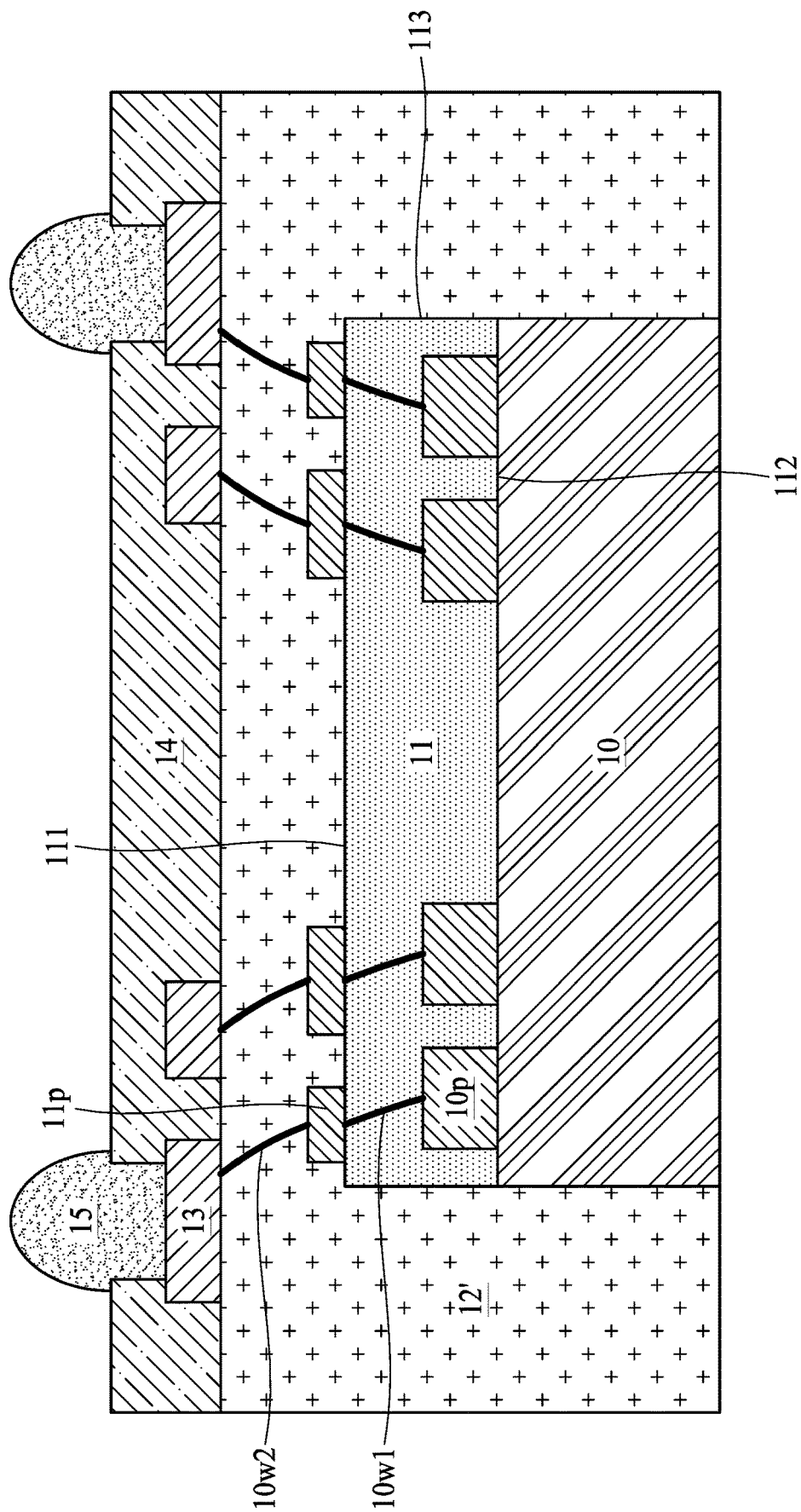
FIG. 1B illustrates a cross-sectional view of some embodiments of a semiconductor package device in accordance with the first aspect of the present disclosure.

FIG. 1B illustrates a cross-sectional view of some embodiments of a semiconductor package device 1B in accordance with the first aspect of the present disclosure. The semiconductor package device 1B is similar to the semiconductor package device 1A shown in FIG. 1A except that conductive pads 11p are disposed on the first surface 111 of the insulation layer 11 and respectively electrically connected to the conductive wires 10w1, and the semiconductor package device 1B includes a package body 12' (which can be similar to the package body 12 and can be implemented in place of the package body 12) that extends over the insulation layer 11 and covers the conductive pads 11p, and the semiconductor package device 1B further includes additional conductive wires 10w2 disposed between the insulation layer 11 and the protective layer 14.

The conductive wires 10w2 are disposed on the conductive pads 11p. The conductive pads 11p constitute at least part of an RDL or other patterned conductive layer. A L/S of the RDL that includes the conductive pads 11p is larger than that of an RDL that includes the conductive contacts 10p (e.g. the L/S of the conductive pads 11p is larger than that of the conductive contacts 10p). In some embodiments, the conductive wires 10w1 and 10w2 include a same material. The conductive wires 10w1 and 10w2 may include different materials. In some embodiments, a L/S of the interconnection layer 13 is larger than that of the RDL that includes the conductive contacts 11p.

The package body 12' is disposed on the lateral surface 103 of the electronic component 10, the first surface 111 and the lateral surface 113 of the insulation layer 11. In some embodiments, the package body 12' includes an epoxy resin having fillers, a molding compound (e.g., an epoxy molding compound or other molding compound), a polyimide, a phenolic compound or material, a material with a silicone dispersed therein, or a combination thereof.

Figure 2A:
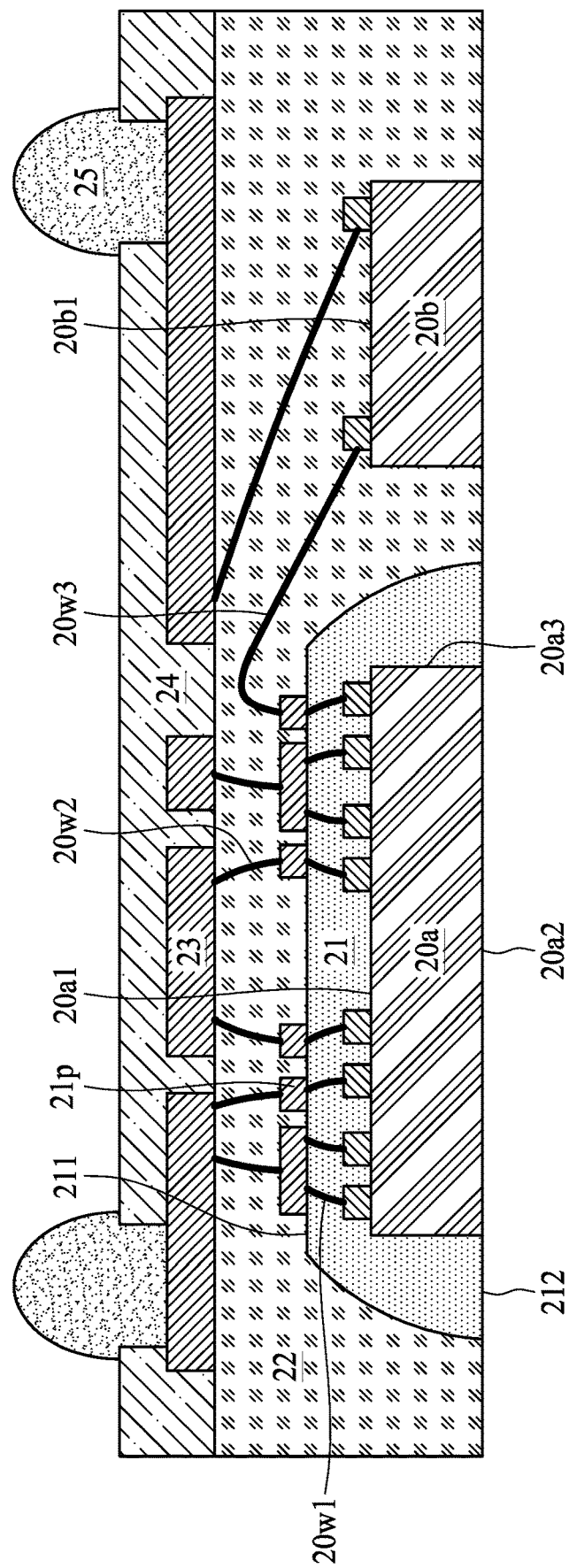
FIG. 2A illustrates a cross-sectional view of some embodiments of a semiconductor package device in accordance with a second aspect of the present disclosure.

FIG. 2A illustrates a cross-sectional view of some embodiments of a semiconductor package device 2A in accordance with a second aspect of the present disclosure. The semiconductor package device 2A includes electronic components 20a, 20b, an insulation layer 21, a package body 22, an interconnection layer 23, a protective layer 24 and electrical contacts 25.

The electronic component 20a has an active surface 20a1, a back surface 20a2 (also referred to as backside) opposite to the active surface 20a1 and a lateral surface 20a3 extending between the active surface 20a1 and the back surface 20a2. The electronic component 20a may include a chip or a die and can include a semiconductor substrate, one or more integrated circuit devices and/or one or more overlying interconnection structures therein. The integrated circuit devices may include active devices such as transistors and/or passive devices such resistors, capacitors, inductors, or a combination thereof.

A plurality of conductive wires 20w1 are respectively electrically connected to conductive contacts 20p disposed on the active surface 20a1 of the electronic component 20a. The conductive contacts 20p are connected to, or can constitute a part of, an RDL within the electronic component 20a. In some embodiments, a L/S of the RDL that includes the conductive contacts 20p is equal to or less than about 2 μm/about 2 μm. In some embodiments, each of the conductive wires 20w1 is a portion of a bonding wire. In some embodiments, the width of the conductive wires 20w1 is about 15 μm to about 25 μm. In some embodiments, the conductive wires 20w1 include Au, Ag, Cu, Pt, Ti, W, Ni or other suitable metals or alloys.

The insulation layer 21 is disposed on the active surface 20a1 and the lateral surface 20a3 of the electronic component 20a to cover the active surface 20a1 and the lateral surface 20a3 of the electronic component 10 and a portion of the conductive wires 20w1. One terminal of each conductive wire 20w1 is exposed from the insulation layer 21. In some embodiments, the insulation layer 21 includes a resin devoid of a filler, such as an epoxy resin without fillers, a polyimide, a phenolic compound or material, a material with a silicone dispersed therein, or a combination thereof. In some embodiments, the insulation layer 21 includes a potting glue. As shown in FIG. 2A, the insulation layer 21 can be substantially bell-shaped (e.g. a top surface of the insulation layer 21 adjacent to or disposed on the active surface of the electronic component 20a is substantially parallel to a bottom surface of the insulation layer opposite to the top surface, and the bottom surface is wider than is the top surface). In some embodiments, the insulation layer 21 is tapered from the bottom surface toward the top surface. In other embodiments, the insulation layer 21 can be substantially cylinder-shaped. For example, the top surface and a lateral surface of the insulation layer 21 can be substantially perpendicular to each other.

Conductive pads 21p are disposed on the insulation layer 21 and electrically connected to the exposed portion of the conductive wires 20w1, and a plurality of conductive wires 20w2 are respectively disposed on the conductive pads 21p. One or more of the conductive wires 20w2 (e.g., conductive wire 20w3) are electrically connected to an active surface 20b1 of the electronic component 20b. The width of the conductive wires 20w2 is larger than that of the conductive wires 20w1. In some embodiments, the conductive wires 20w1 and 20w2 include a same material. The conductive wires 20w1 and 20w2 may include different materials. In some embodiments, the width of the conductive wire 20w1 is different from that of the conductive wire 20w3. For example, if the electronic component 20b is a high power electronic component (e.g., a power die), it can be advantageous to set the width of the conductive wire 20w3 (e.g., a width in a range of about 20 μm to about 75 μm) connected to the electronic component 20b to be greater than that of the conductive wire 20w1.

The insulation layer 21 and the conductive wires 20w1 constitute a fine-line RDL that can provide for a fan-out structure for the electronic component 20a. In some embodiments, the fine-line RDL can be achieved by using an interposer or copper pillars. However, the cost for manufacturing the interposer having a fine-line structure or copper pillars can be expensive. By using bonding wires (e.g., conductive wires 20w1) for a fine-line RDL, the manufacturing cost and time can be reduced.

The package body 22 is disposed to cover external surfaces of the insulation layer 21, the electronic components 20b and a portion of the conductive wires 20w2, 20w3. One terminal of at least some conductive wires 20w2 is exposed from the package body 22. In some embodiments, the package body 22 includes an epoxy resin having fillers, a molding compound (e.g., an epoxy molding compound or other molding compound), a polyimide, a phenolic compound or material, a material with a silicone dispersed therein, or a combination thereof. In some embodiments, the package body 22 and the insulation layer 21 include a same material.

The interconnection layer 23 (which can include, for example, an RDL) is disposed on the package body 22. The interconnection layer 23 is electrically connected to the exposed portion of the conductive wires 20w2. A L/S of the interconnection layer 23 (e.g. a L/S of conductive pads of the interconnection layer 23) is larger than that of an RDL that includes the conductive pads 21p, and larger than that of the RDL that includes the conductive contacts 20p. In some embodiments, the L/S of the interconnection layer 23 is larger than about 7 μm/about 7 μm.

The protective layer 24 is disposed on the package body 22 to cover a portion of the interconnection layer 23. The protective layer 24 defines openings that expose a portion of the interconnection layer 23. In some embodiments, the protective layer 24 includes a solder resist or a solder mask.

Electrical contacts 25 are disposed within the openings of the protective layer 24 and electrically connected to the exposed portion of the interconnection layer 23. In some embodiments, electrical contacts 25 include C4 bumps, solder balls or a LGA.

Figure 2B:
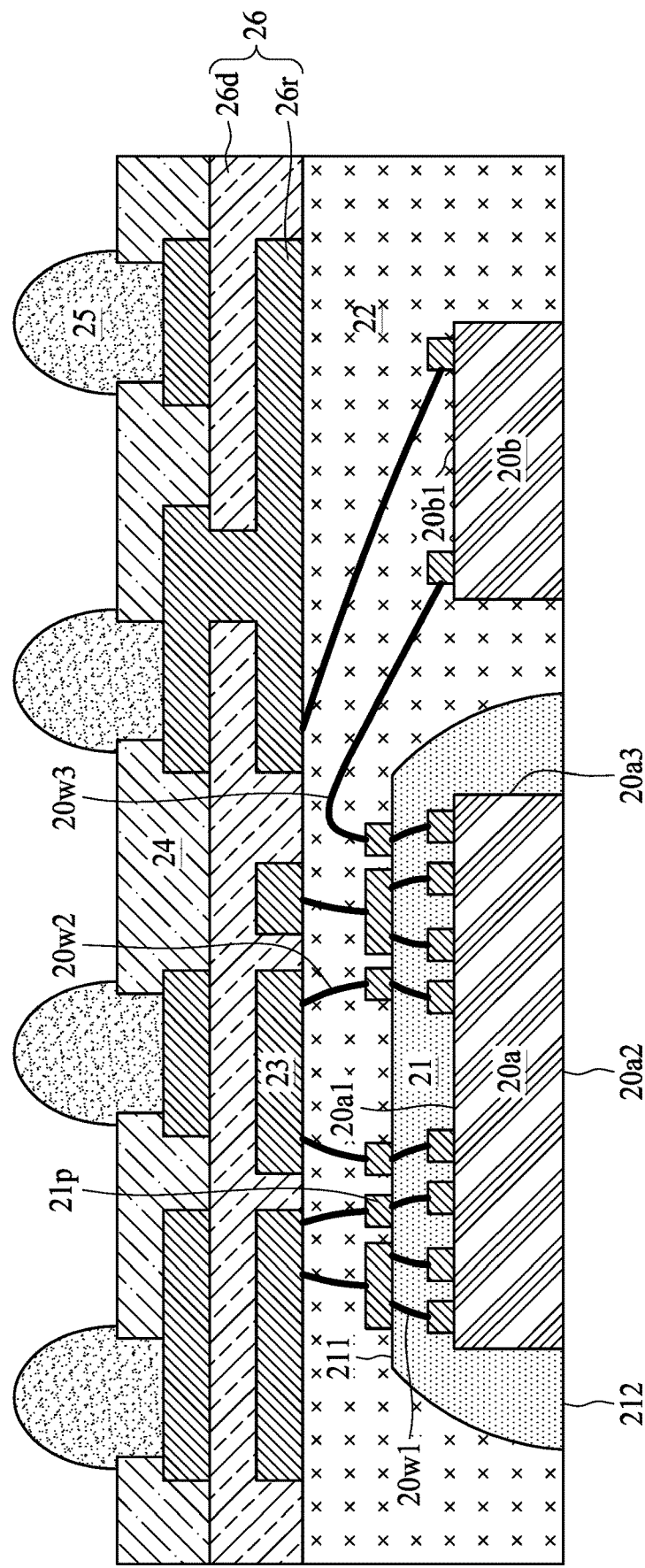
FIG. 2B illustrates a cross-sectional view of some embodiments of a semiconductor package device in accordance with the second aspect of the present disclosure.

FIG. 2B illustrates a cross-sectional view of some embodiments of a semiconductor package device 2B in accordance with the second aspect of the present disclosure. The semiconductor package device 2B is similar to the semiconductor package device 2A shown in FIG. 2A except that the semiconductor package device 2B further includes an RDL 26 disposed between the package body 22 and the protective layer 24.

The RDL 26 includes an interconnection layer 26r and a dielectric layer 26d. The interconnection later 26r is disposed on the package body 22 and electrically connected to the exposed portion of the conductive wires 20w2. A L/S of the interconnection layer 26r is larger than that of an RDL that includes the conductive pads 21p.

The dielectric layer 26d is disposed on the package body 22 and covers the interconnection layer 26r. In some embodiments, the dielectric layer 26d includes a same material as the insulation layer 21, the package body 22 or the protective layer 24. The dielectric layer 26d may include different materials. In some embodiments, there may be any number of RDLs disposed between the package body 22 and the protective layer 24 depending on design specifications.

Figure 2C:
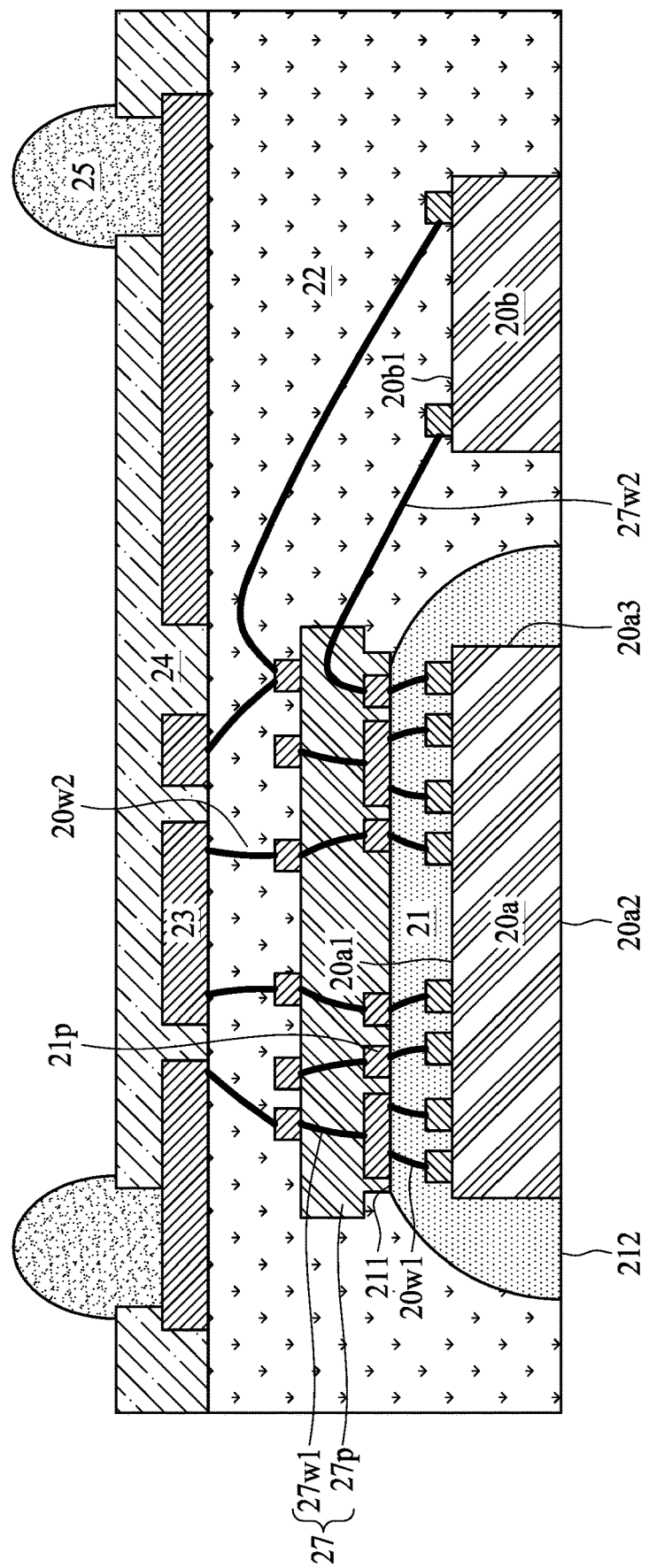
FIG. 2C illustrates a cross-sectional view of some embodiments of a semiconductor package device in accordance with the second aspect of the present disclosure.

FIG. 2C illustrates a cross-sectional view of some embodiments of a semiconductor package device 2C in accordance with the second aspect of the present disclosure. The semiconductor package device 2C is similar to the semiconductor package device 2A shown in FIG. 2A except that the semiconductor package device 2C further includes an RDL 27 disposed between the conductive wires 20w1 and 20w2.

The RDL 27 includes conductive wires 27w1, 27w2 and a package body 27p. The conductive wires 27w are disposed on conductive pads 21p that are disposed on the insulation layer 21 and that are electrically connected to the exposed portion of the conductive wires 20w1. One or more of the conductive wires 27 (e.g., conductive wire 27w2) are electrically connected to an active surface 20b1 of the electronic component 20b. A L/S of conductive pads (to which the conductive wires 27w1, 27w2 are attached on an upper surface of the package body 27p) is larger than that of an RDL that includes the conductive pads 21p. In some embodiments, the conductive wires 27w1, 27w2 and 20w1 include a same material. The conductive wires 27w1, 27w2 and 20w1 may include different materials.

The package body 27p is disposed on the insulation layer 21 and covers a portion of the conductive wires 27w1, 27w2. One terminal of at least some conductive wires 27w1 is exposed from the package body 27p. In some embodiments, the package body 27p and the package body 22 or the insulation layer 21 include a same material. The package body 27p and the package body 22 or the insulation layer 21 may include different materials. In some embodiments, there may be any number of RDLs disposed between the conductive wires 20w1 and 20w2 depending on design specifications.

Figure 2D:
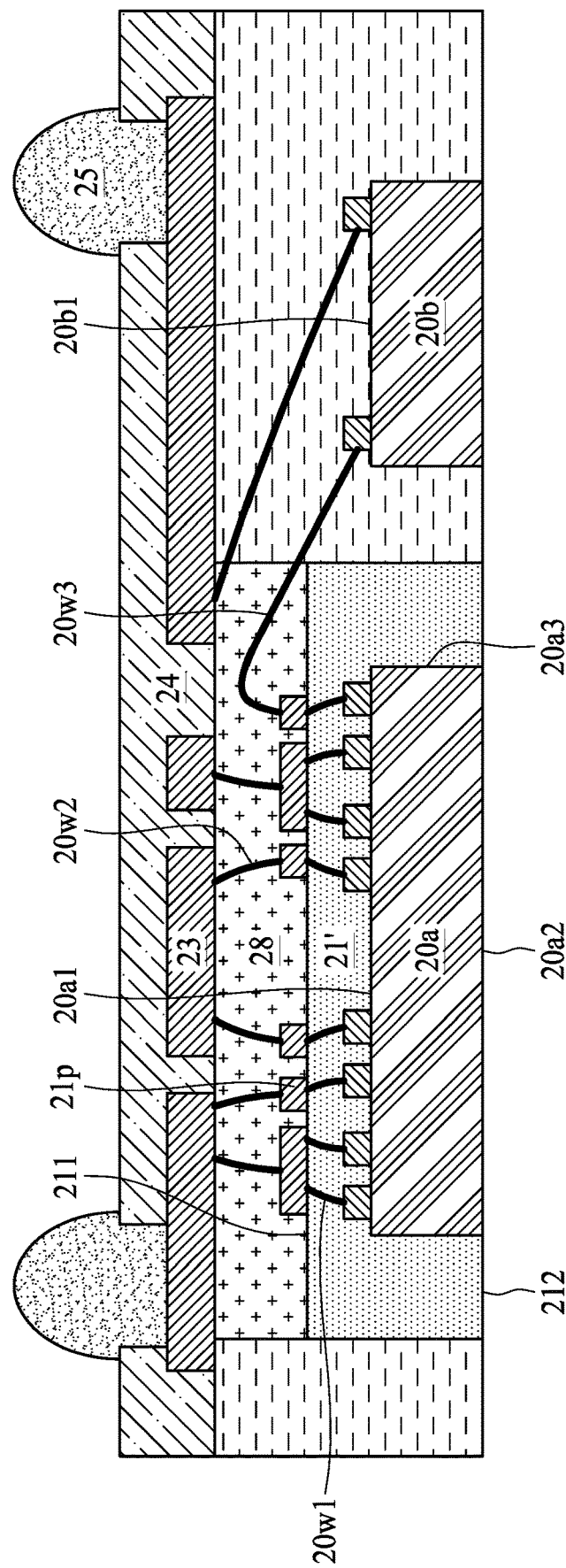
FIG. 2D illustrates a cross-sectional view of some embodiments of a semiconductor package device in accordance with the second aspect of the present disclosure.

FIG. 2D illustrates a cross-sectional view of some embodiments of a semiconductor package device 2D in accordance with of the second aspect of the present disclosure. The semiconductor package device 2D is similar to the semiconductor package device 2C shown in FIG. 2C except that and the semiconductor package device 2D includes an insulation layer 21' (which can be similar to the insulation layer 21 and can be implemented in place of the insulation layer 21). The insulation layer 21' of the semiconductor package device 2D is in a substantially square or substantially rectangle shape from a top view, and/or has lateral surfaces that are substantially perpendicular to a top surface. The semiconductor package device 2D further includes a package body 28 disposed between the insulation layer 21' and the protective layer 24. In some embodiments, a lateral surface of the package body 28 is substantially coplanar with a lateral surface of the insulation layer 21'.

FIG. 3A, FIG. 3B, FIG. 3C, FIG. 3D, FIG. 3E, FIG. 3F, FIG. 3G and FIG. 3H are cross-sectional views of a semiconductor structure at various stages of fabrication, in accordance with some embodiments of a method of manufacturing a semiconductor package device of the present disclosure. Various figures have been simplified to more clearly present aspects of the present disclosure.

Figure 3A:
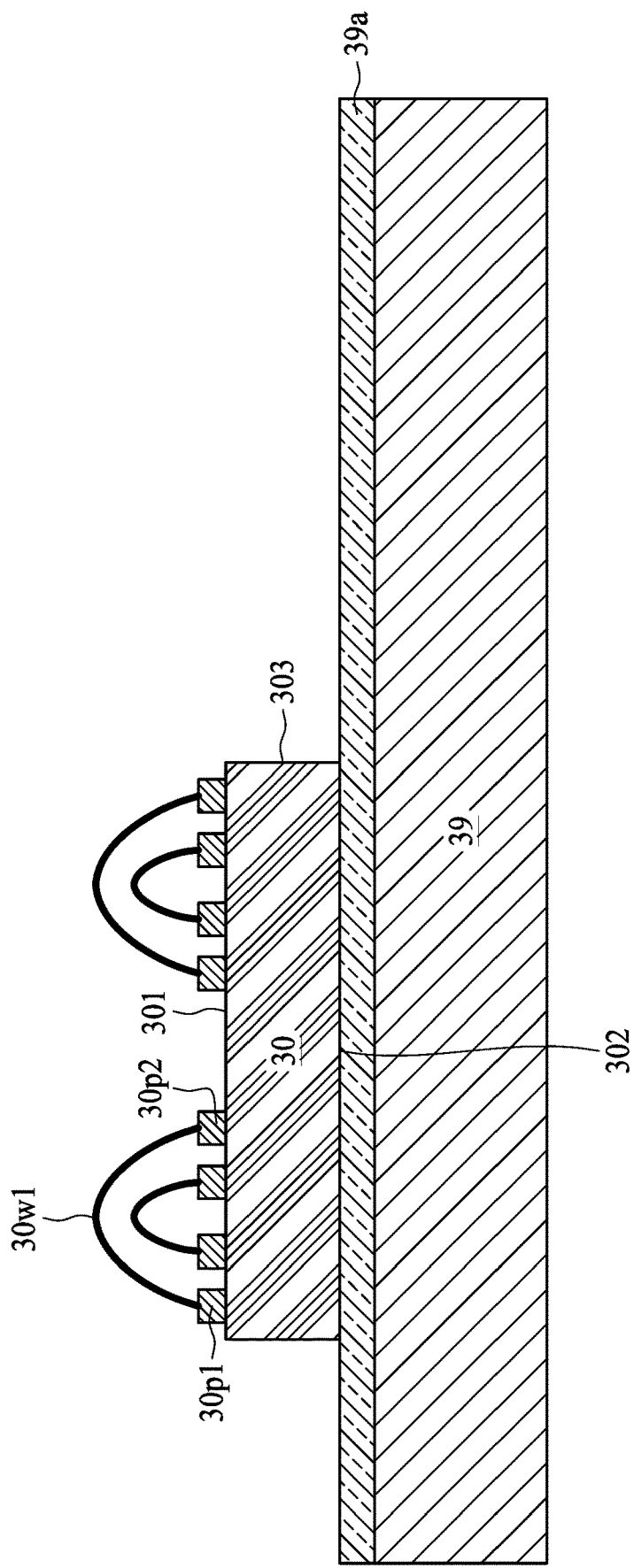
FIG. 3A, FIG. 3B, FIG. 3C, FIG. 3D, FIG. 3E, FIG. 3F, FIG. 3G and FIG. 3H illustrate a method of manufacturing a semiconductor package device in accordance with some embodiments of the present disclosure.

Referring to FIG. 3A, a carrier 39 with an adhesive 39a (e.g., a tape) disposed thereon is provided. An electronic component 30 is attached to the carrier 39 through the adhesive 39a, which can help to facilitate subsequent processes. The electronic component 30 has an active surface 301 on which electrical contacts 30p1 and 30p2 are disposed, a back surface 302 (also referred to as backside) opposite to the active surface 301 and a lateral surface 303 extending between the active surface 301 and the back surface 302. The back surface 302 of the electronic component 30 is attached to the carrier 39.

Conductive wires 30w1 are then formed or disposed to electrically connect one electrical contact to another electrical contact on the active surface 301 of the electronic component 30. For example, the conductive wire 30w1 electrically connects the electrical contact 30p1 to the electrical contact 30p2. In some embodiments, the conductive wires 30w1 may be formed by ball wire-bonding, wedge wire-bonding or other suitable processes. In some embodiments, a L/S of an RDL that includes the electrical contacts 30p1, 30p2 is less than or equal to about 2 μm/about 2 μm. In some embodiments, the conductive wires 30w1 include Au, Ag, Cu, Pt, Ti, W, Ni or other suitable metals or alloys.

Figure 3B:
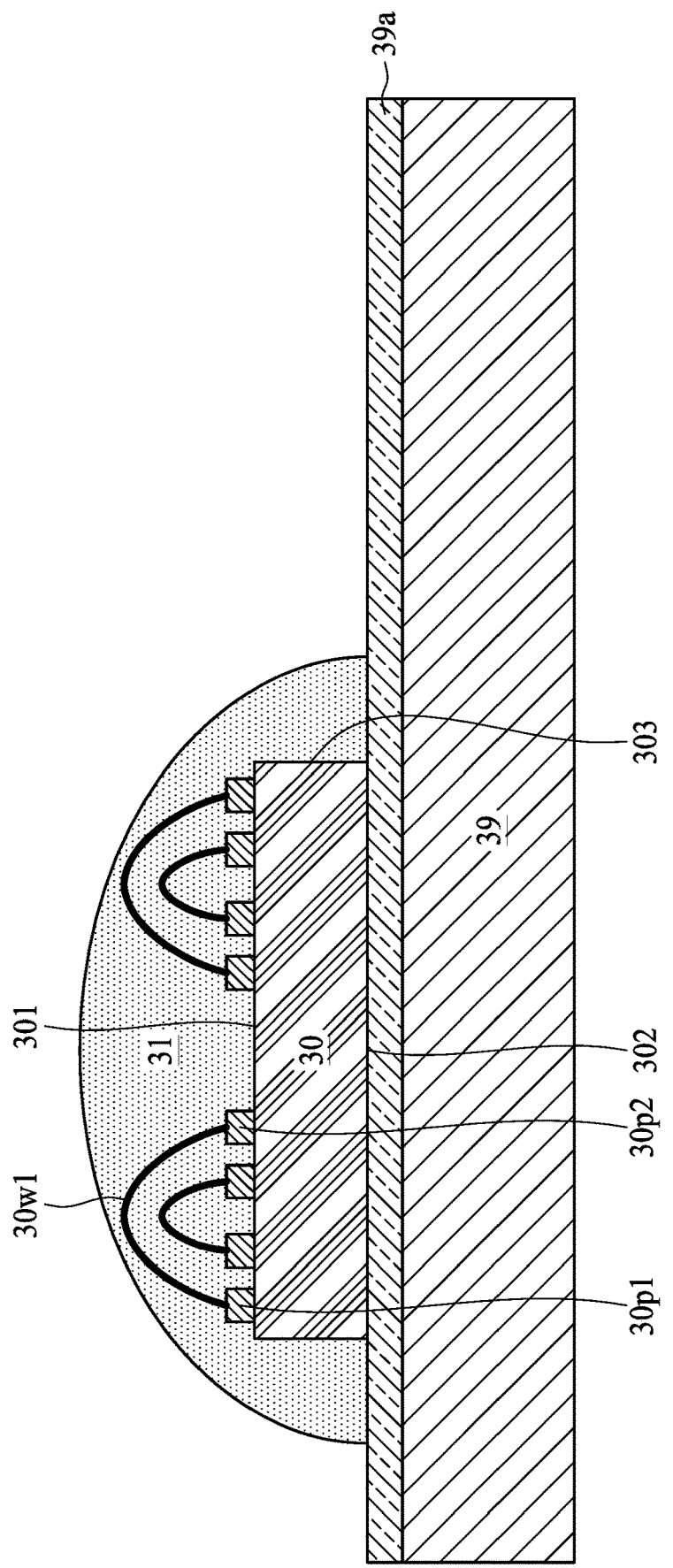

Referring to FIG. 3B, an insulation layer 31 is formed on the carrier 39 to cover the electronic component 30 and the conductive wires 30w1. In some embodiments, the insulation layer 31 includes an epoxy resin without fillers, a polyimide, a phenolic compound or material, a material with a silicone dispersed therein, or a combination thereof. In some embodiments, the insulation layer 31 is formed by a potting process, which may help to avoid issues of wire sweep/shift (which can adversely affect performance of the semiconductor device package) or wire contact (which can cause short circuit or damage of the wire) caused by a subsequent molding process. In some embodiments, the insulation layer 31 is formed by applying an insulating material devoid of a filler, and then curing the insulating material.

Figure 3C:
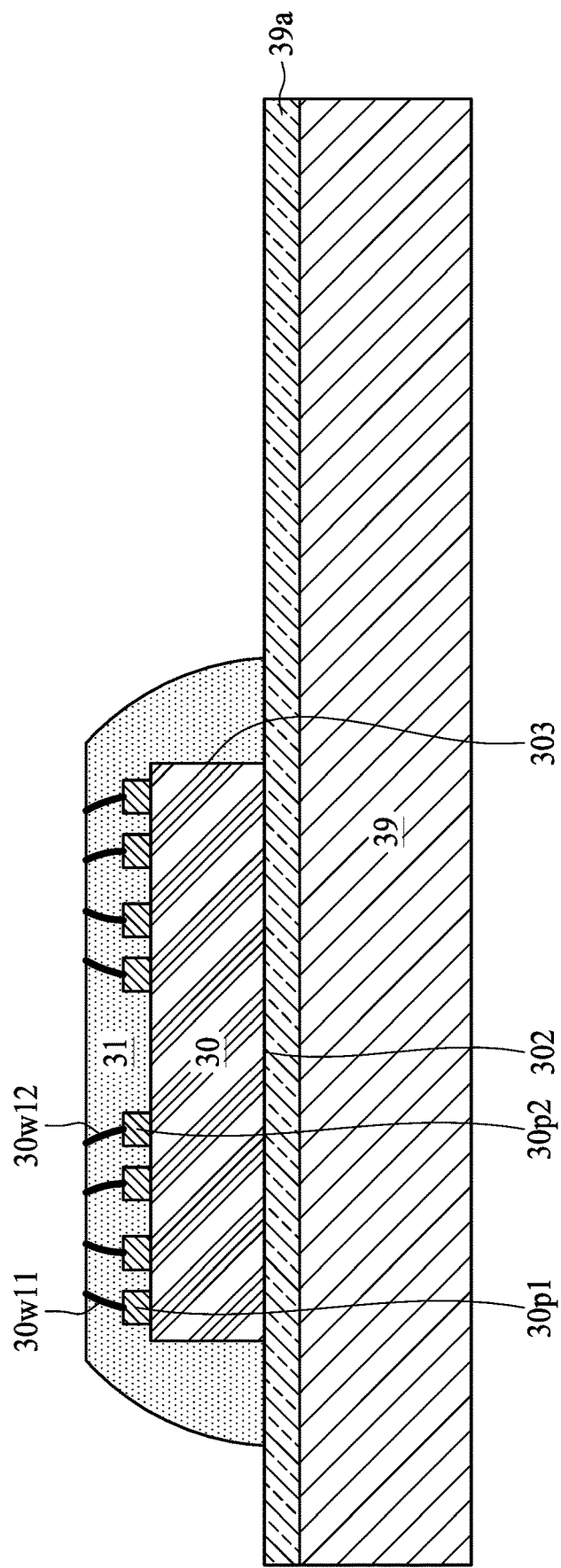

Referring to FIG. 3C, a portion of the insulation layer 31 and conductive wires 30w1 are removed to expose a remaining portion of the conductive wires, the remaining portion including the conductive wires 30w11, 30w12. For example, after the operation shown in FIG. 3C, the conductive wire 30w1 shown in FIG. 3B is divided into the conductive wires 30w11 and 30w12 as shown in FIG. 3C. One terminal of each of the divided conductive wires 30w11, 30w12 is exposed from the insulation layer 31. In some embodiments, the insulation layer 31 and conductive wires 30w1 can be removed by grinding or other suitable processes.

Figure 3D:
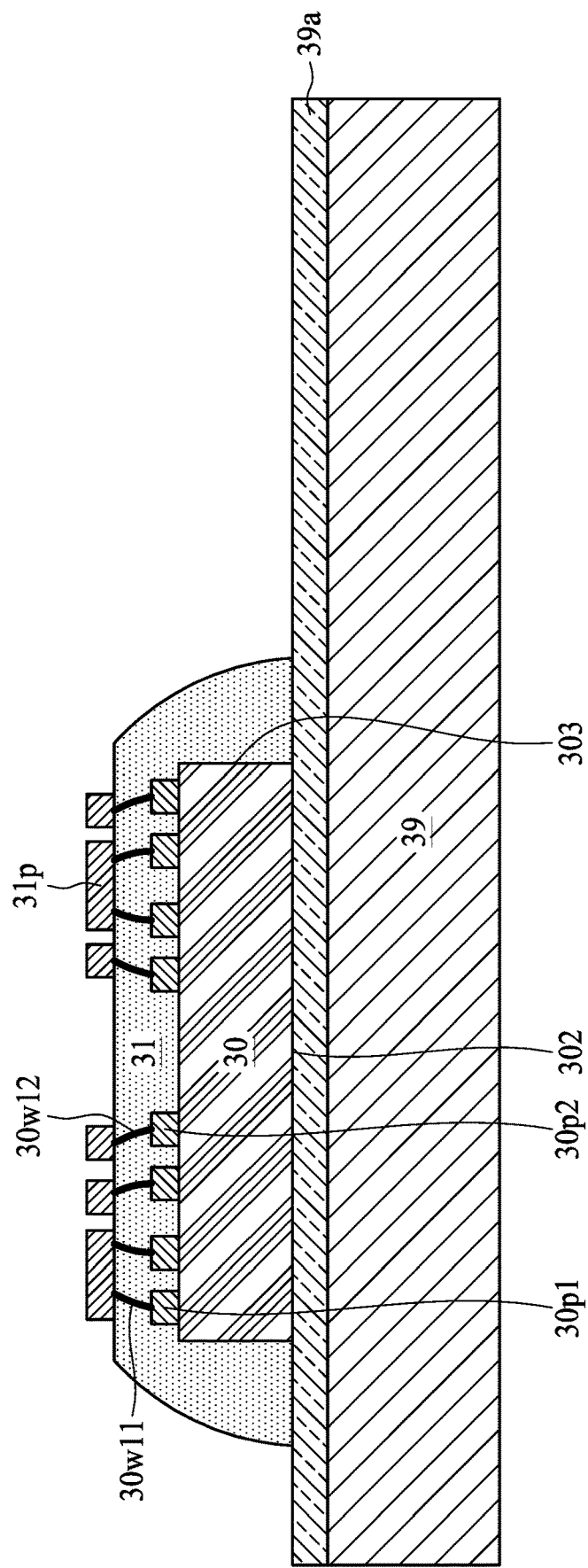

Referring to FIG. 3D, a patterned conductive layer 31p is formed on the insulation layer 31 to electrical contact the exposed portion of the conductive wires 30w11, 30w12. In some embodiments, the patterned conductive layer 31p may be formed by a process that includes the following operations: (i) forming a photoresist or mask on the insulation layer 31; (ii) defining a predetermined pattern on the photoresist or mask by, for example, lithographic technique; (iii) plating conductive material to form the patterned conductive layer 31p; and (iv) removing the photoresist or mask.

Figure 3E:
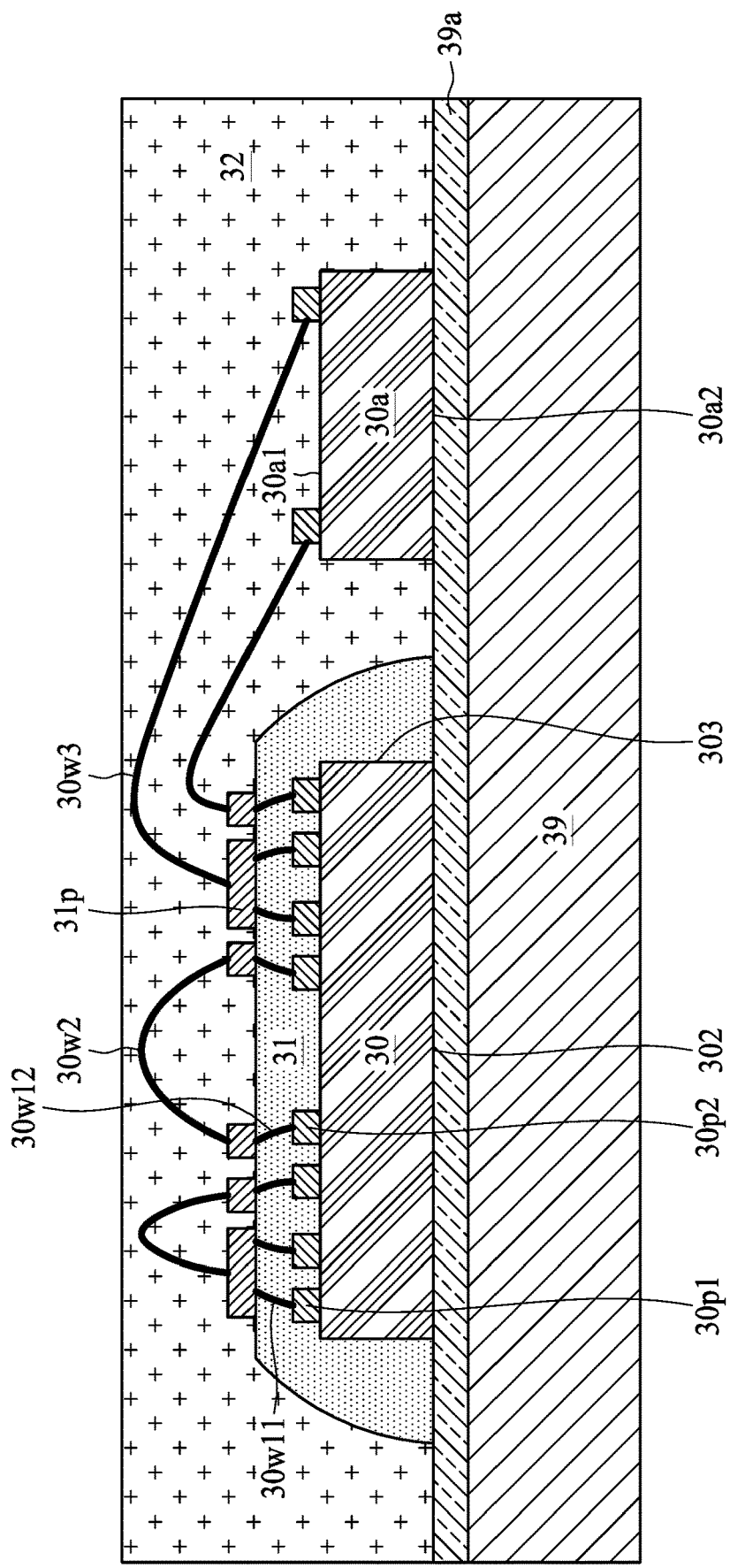

Referring to FIG. 3E, conductive wires 30w2 are formed to electrically connect one conductive pad of the patterned conductive layer 31p to another conductive pad of the patterned conductive layer 31p. In some embodiments, the conductive wires 30w2 may be formed by ball wire-bonding, wedge wire-bonding or other suitable processes. The conductive wires 30w1 and 30w2 can be formed by a same or different processes. In some embodiments, the width of the conductive wires 30w2 is larger than that of the conductive wires 30w1. In some embodiments, the conductive wires 30w2 include Au, Ag, Cu, Pt, Ti, W, Ni or other suitable metals or alloys.

An electronic component 30a is attached to the carrier 39 through the adhesive 39a. The electronic component 30a has an active surface 30a1, a back surface 30a2 (also referred to as backside) opposite to the active surface 30a1. The back surface 30a2 of the electronic component 30a is attached to the carrier 39. One or more of the conductive wires 30w2 (e.g., conductive wire 30w3) are electrically connected to the active surface 30a1 of the electronic component 30a.

A package body 32 is then formed to cover external surfaces of the insulation layer 31, the electronic components 30a and the conductive wires 30w2, 30w3. In some embodiments, the package body 32 includes an epoxy resin having fillers, a molding compound (e.g., an epoxy molding compound or other molding compound), a polyimide, a phenolic compound or material, a material with a silicone dispersed therein, or a combination thereof. In some embodiments, the package body 32 and the insulation layer 31 include a same material.

Figure 3F:
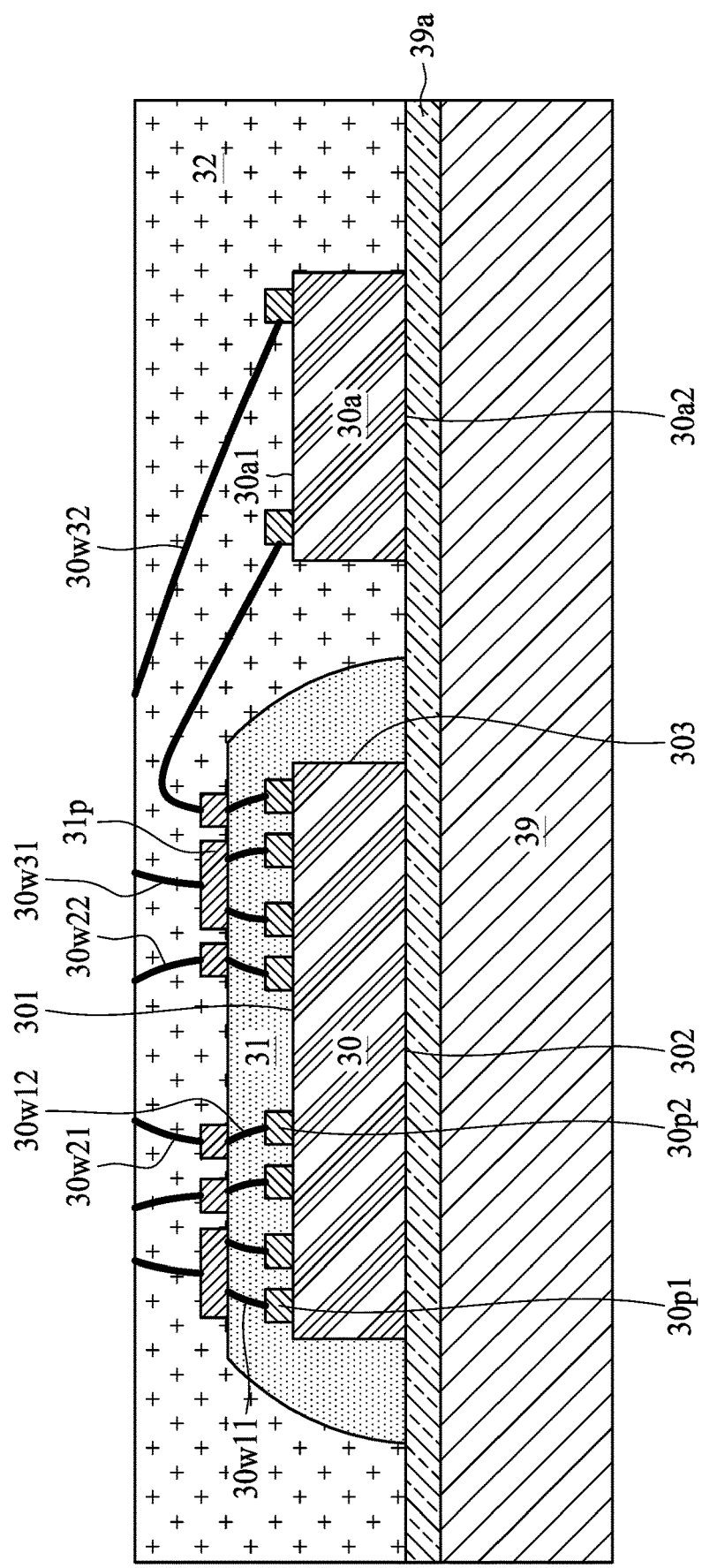

Referring to FIG. 3F, a portion of the package body 32 and conductive wires 30w2, 30w3 are removed to expose a remaining portion of the conductive wires, the remaining portion including the conductive wires 30w21, 30w31. For example, after the operation shown in FIG. 3E, the conductive wire 30w2 shown in FIG. 3E is divided into the conductive wires 30w21 and 30w22 as shown in FIG. 3F. Similarly, the conductive wire 30w3 shown in FIG. 3E is divided into the conductive wires 30w31 and 30w32 as shown in FIG. 3F. One terminal of each of the divided conductive wires 30w21, 30w22, 30w31 and 30w32 is exposed from the package body 32. In some embodiments, the package body 32 and conductive wires 30w2, 30w3 can be removed by grinding or other suitable processes.

Figure 3G:
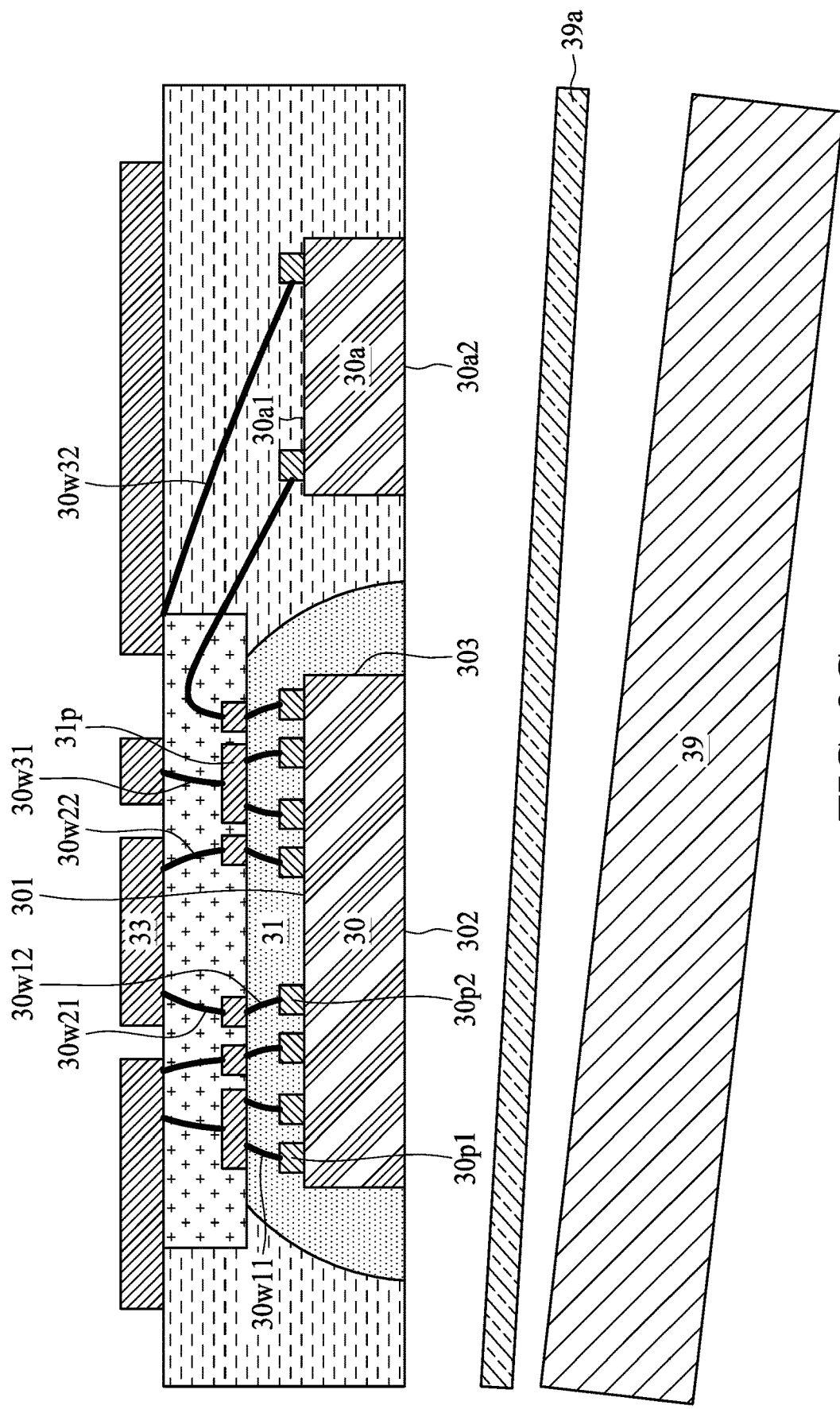

Referring to FIG. 3G, a patterned conductive layer 33 is formed on the package body 32 to electrical contact the exposed portion of the conductive wires 30w21, 30w22, 30w31 and 30w32. In some embodiments, the patterned conductive layer 33 may be formed by a process that includes the following operations: (i) forming a photoresist or mask on the package body 32; (ii) defining a predetermined pattern on the photoresist or mask by, for example, lithographic technique; (iii) plating conductive material to form the patterned conductive layer 33; and (iv) removing the photoresist or mask. A L/S of the patterned conductive layer 33 (e.g. a L/S of conductive pads of the patterned conductive layer 33) is larger than that of at least one of (i) an RDL that includes the electrical contacts 30p1, 30p2, and (ii) an RDL that includes the patterned conductive layer 31p. In some embodiments, the L/S of the patterned conductive layer 33 is larger than about 7 μm/about 7 μm. Then, the carrier 39 and the adhesive 39a are removed from the package body 32.

Figure 3H:
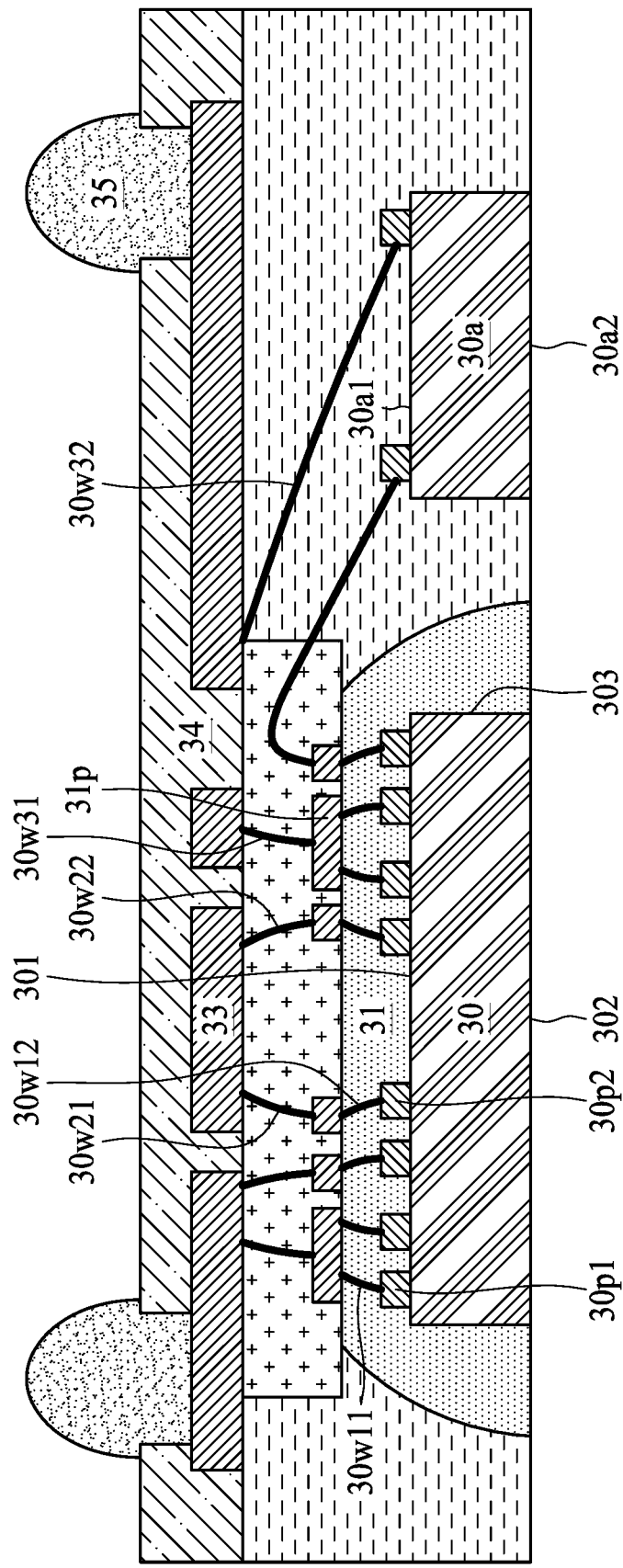

Referring to FIG. 3H, a protective layer 34 is formed on the package body 32 to cover the patterned conductive layer 33. A plurality of openings are formed in the protective layer 34 to expose a portion of the patterned conductive layer 33. In some embodiments, the protective layer 34 is a solder resist or a solder mask.

Electrical contacts 35 are then formed within the openings of the protective layer 34 and electrically connected to the exposed portion of the interconnection layer 33. In some embodiments, electrical contacts 35 include C4 bumps, solder balls or a LGA.

Figure 4A:
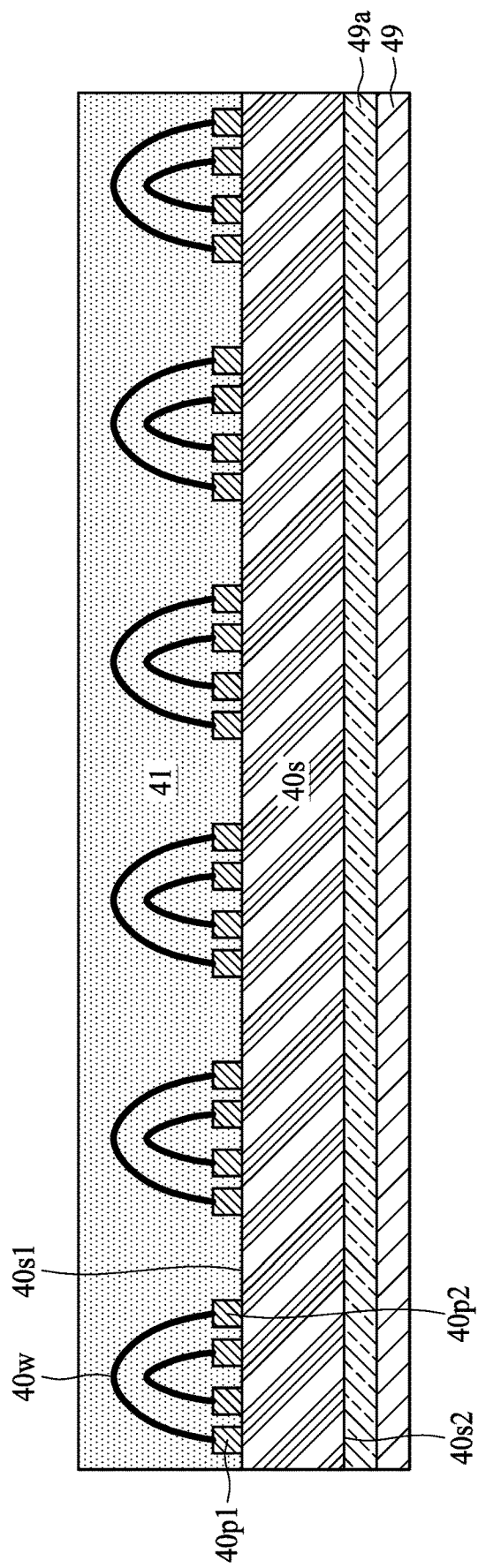
FIG. 4A, FIG. 4B and FIG. 4C illustrate a method of manufacturing a semiconductor package device in accordance with some embodiments of the present disclosure.
Figure 4B:
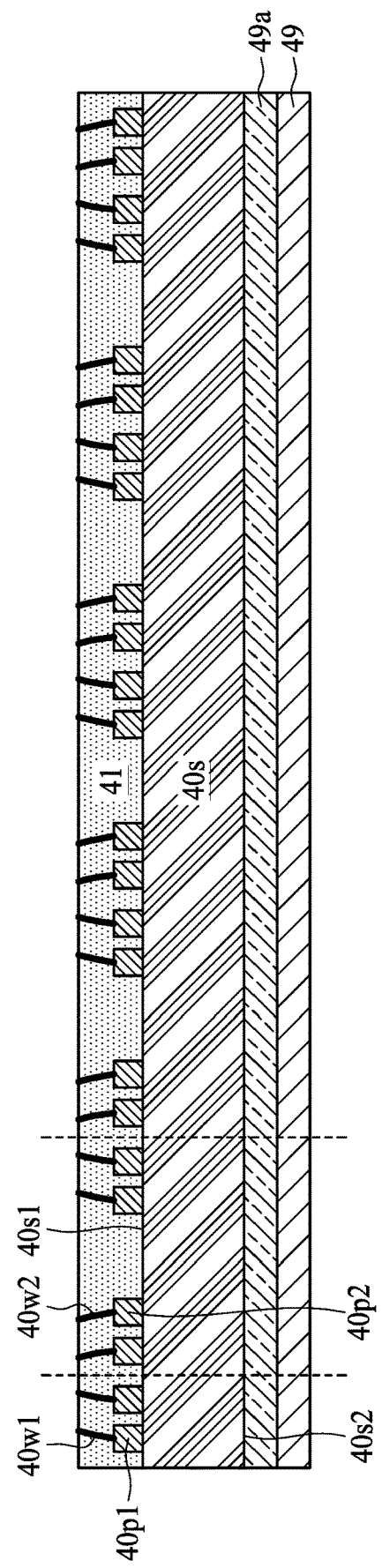
Figure 4C:
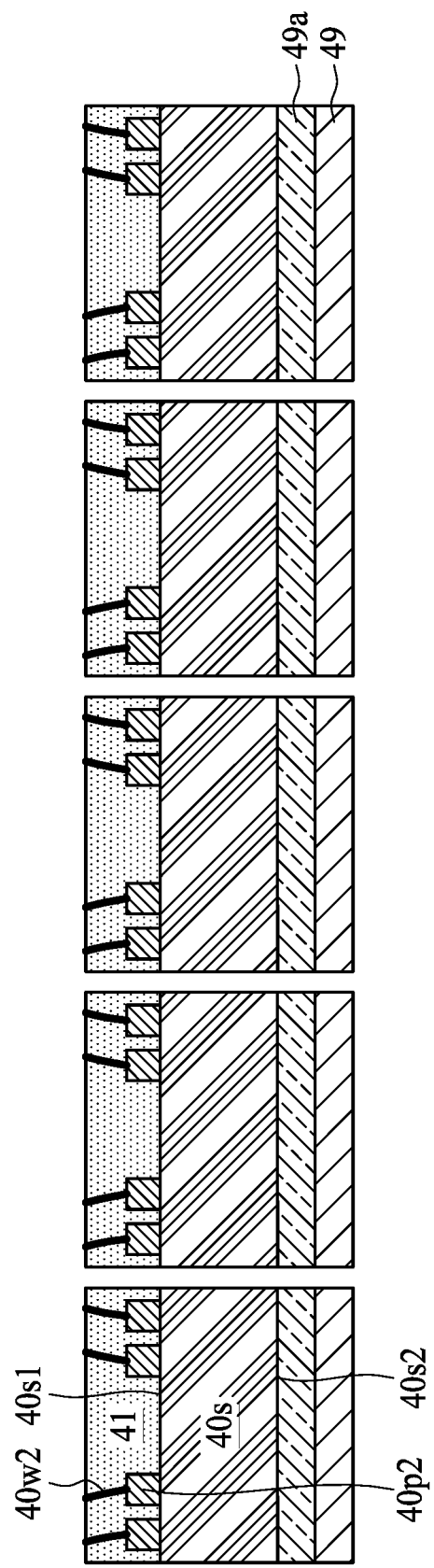

FIGS. 4A, 4B and 4C are cross-sectional views of a semiconductor structure at various stages of fabrication, in accordance with some embodiments of a method of manufacturing a semiconductor package device of the present disclosure. Various figures have been simplified to more clearly present aspects of the present disclosure.

Referring to FIG. 4A, a carrier 49 with an adhesive 49a (e.g., a tape) disposed thereon is provided and a die strip (e.g., a wafer) 40s is attached to the carrier 49 through the adhesive 49a. The die strip 40s has an active surface 40s1 having electrical contacts disposed thereon (e.g. an electrical contact 40p1 and an electrical contact 40p2) and a back surface 40s2 (also referred to as backside) opposite to the active surface 40s1. Each die of the die strip may include a semiconductor substrate, one or more integrated circuit devices and/or one or more overlying interconnection structures therein. The integrated circuit devices may include one or more active devices such as transistors and/or passive devices such resistors, capacitors, inductors or a combination thereof.

Conductive wires 40w are formed to electrically connect one electrical contact to another electrical contact on the active surface 40s1 of the die strip 40s. For example, the conductive wire 40w electrically connects the electrical contact 40p1 to the electrical contact 40p2. In some embodiments, the conductive wires 40w may be formed by ball wire-bonding, wedge wire-bonding or other suitable processes. In some embodiments, a L/S of the RDL connected to the electrical contacts 40p1, 40p2 is less than or equal to about 2 μm/about 2 μm. In some embodiments, the conductive wires 40w include Au, Ag, Cu, Pt, Ti, W, Ni or other suitable metals or alloys.

An insulation layer 41 is formed to cover the active surface 40s1 of the die strip 40s. In some embodiments, the insulation layer 41 includes an epoxy resin without fillers, a polyimide, a phenolic compound or material, a material with a silicone dispersed therein, or a combination thereof. In some embodiments, the insulation layer 41 is formed by a potting process, which may avoid issues of wire sweep/shift (which can adversely affect performance of the semiconductor device package) or wire contact (which can cause short circuit or damage of the wire) caused by a subsequent molding process.

Referring to FIG. 4B, a portion of the insulation layer 41 and conductive wires 40w are removed to expose a remaining portion of the conductive wires, the remaining portion including the conductive wires 40w1, 40w2. For example, after the operation shown in FIG. 4B, the conductive wire 40w shown in FIG. 4A is divided into the conductive wires 40w1 and 40w2 as shown in FIG. 4B. One terminal of each of the divided conductive wires 40w1 and 40w2 is exposed from the insulation layer 41. In some embodiments, the insulation layer 41 and conductive wires 40w can be removed by grinding or other suitable processes.

Referring to FIG. 4C, a singulation process is performed to separate out individual semiconductor package devices. That is, the singulation process is performed through the insulation layer 41 and the die strip 40s. The singulation process may be carried out, for example, by using a dicing saw, laser or other appropriate cutting technique.

Figure 5B:
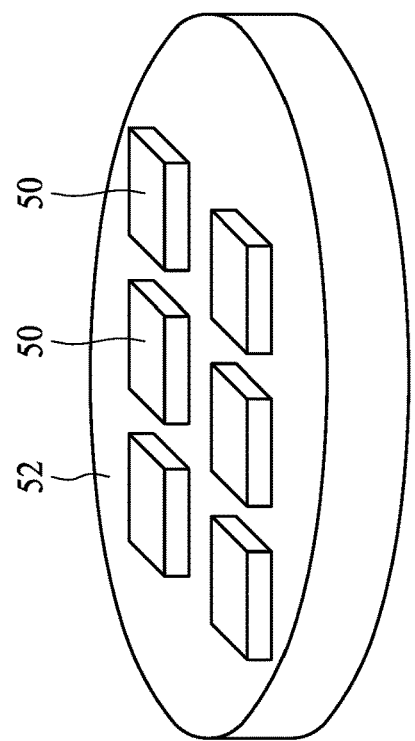
FIG. 5A and FIG. 5B illustrate different types of semiconductor package devices in accordance with some embodiments of the present disclosure.
Figure 5A:
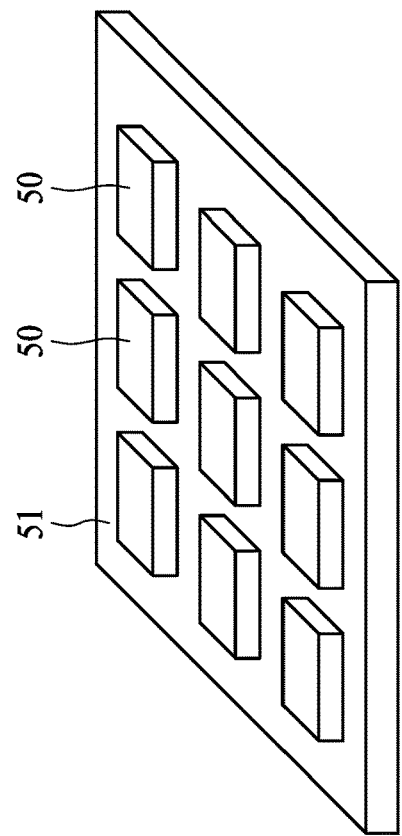

FIG. 5A and FIG. 5B illustrate different types of semiconductor package devices in accordance with some embodiments of the present disclosure.

As shown in FIG. 5A, a plurality of chips 50 or dies are placed on a substantially square-shaped carrier 51 (e.g. in accordance with one or more embodiments described herein). In some embodiments, the carrier 51 may include organic materials (e.g., molding compound, Bismaleimide Triazine (BT), Polyimide (PI), Polybenzoxazole (PBO), solder resist, Ajinomoto build-up film (ABF), Polypropylene (PP) or Epoxy-based material) and/or inorganic materials (e.g., silicon, glass, ceramic or quartz).

As shown in FIG. 5B, a plurality of chips 50 or dies are placed on a substantially circle-shaped carrier 52 (e.g. in accordance with one or more embodiments described herein). In some embodiments, the carrier 52 may include organic materials (e.g., molding compound, BT, PI, PBO, solder resist, ABF, PP or Epoxy-based material) and/or inorganic materials (e.g., silicon, glass, ceramic or quartz).

FIG. 6 illustrates a semiconductor package device 6 in accordance with some embodiments of the present disclosure. The semiconductor package device 6 includes a die 60, conductive wires 60w1, 60w2 and an insulation layer 61 covering the die 60 and the conductive wires 60w1, 60w2.

A height (e.g. a maximum height) of the insulation layer 61 is referred to as "h", a width (e.g. a maximum width) of the insulation layer 61 is referred to as "D", a distance between two conductive wires 60w1 and 60w2 (e.g. a distance between a point where conductive wire 60w1 connects to a pad on a substrate and a point where conductive wire 60w2 connects to a pad on the substrate) is referred to as "d" and a radius of the insulation layer 61 is referred to as "R". According to the Law of conservation of force, h can be calculated from the following equation, where S is tensile force, p is the density of the insulation layer 61:

$$h = ((2S + \rho g R) + \sqrt{(2S + \rho g R)^2 - 16 \rho g R S/3})/(2\rho g)$$

According to the configuration shown in FIG. 6, $2\sqrt{R^2 - (R-h)^2} \geq d$. Therefore, the range of h can be derived as follows:

$$R - \sqrt{R^2 - d^2} \leq h \leq R + \sqrt{R^2 - d^2}.$$

The above equation and inequality show some possible design specifications for forming the insulation layer 61. The above design specifications are applicable, for example, to the operation shown in FIG. 3B.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   an electronic component;
   a first set of conductive wires electrically connected to the electronic component; and
   an insulation layer having a top surface and surrounding the first set of conductive wires, the top surface of the insulation layer exposing a portion of the first set of the conductive wires, the insulation layer being in direct contact with the electronic component;
   a second set of conductive wires disposed on the insulation layer and electrically connected to the exposed portion of the first set of the conductive wires; and
   an encapsulant encapsulating the electronic component and the insulation layer, the encapsulant encapsulating and in direct contact and the second set of conductive wires,
   wherein the first set of conductive wires and the second set of conductive wires are bonding wires, and
   wherein the insulation layer is devoid of a filler.

2. The semiconductor device package of claim 1, further comprising a first patterned conductive layer disposed over the insulation layer and including a plurality of conductive pads, wherein the conductive pads of the first patterned conductive layer are respectively electrically connected to the exposed portion of the first set of conductive wires.

3. The semiconductor device package of claim 2, wherein the electronic component comprises a plurality of conductive contacts electrically connected to the first set of the conductive wires; and
   a pitch between at least two adjacent conductive contacts of the electronic component is less than a pitch between at least two adjacent conductive pads of the first patterned conductive layer.

4. The semiconductor device package of claim 1, wherein the encapsulant covers the electronic component, the insulation layer and the second set of conductive wires.

5. The semiconductor device package of claim 1, wherein a width of at least one of the second set of conductive wires is greater than a width of at least one of the first set of conductive wires.

6. The semiconductor device package of claim 1, wherein
   the top surface of the insulation layer is adjacent to an active side of the electronic component;
   the insulation layer further includes a bottom surface adjacent to a backside of the electronic component; and
   a width of the top surface is less than a width of the bottom surface.

7. The semiconductor device package of claim 1, wherein the insulation layer is a single homogeneous insulation layer.

8. A semiconductor device package, comprising:
an electronic component;
a first set of conductive wires electrically connected to the electronic component;
an insulation layer having a top surface and surrounding the first set of conductive wires, the top surface of the insulation layer exposing a portion of the first set of the conductive wires, the insulation layer being in direct contact with the electronic component, wherein the insulation layer is devoid of a filler;
a second set of conductive wires disposed on the insulation layer and electrically connected to the exposed portion of the first set of the conductive wires; and
a package body encapsulating the insulation layer and the electronic component, the package body encapsulating and in direct contact and the second set of conductive wires,
wherein the first set of conductive wires and the second set of conductive wires are bonding wires, and
wherein the first set of conductive wires is separated from the package body by the insulation layer.

9. The semiconductor device package of claim 8, further comprising a first patterned conductive layer disposed over the insulation layer and including a plurality of conductive pads, wherein the conductive pads of the first patterned conductive layer are electrically connected to the exposed portion of the first set of conductive wires.

10. The semiconductor device package of claim 9, wherein
the electronic component comprises a plurality of conductive contacts electrically connected to the first set of the conductive wires; and
a pitch between at least two adjacent conductive contacts of the electronic component is less than a pitch between at least two adjacent conductive pads of the first patterned conductive layer.

11. The semiconductor device package of claim 8, wherein the package body covers the electronic component, the insulation layer and the second set of conductive wires.

12. The semiconductor device package of claim 8 wherein a width of at least one of the second set of conductive wires is greater than a width of at least one of the first set of conductive wires.

13. The semiconductor device package of claim 8, wherein
the top surface of the insulation layer is adjacent to an active side of the electronic component;
the insulation layer further includes a bottom surface adjacent to a backside of the electronic component; and
the insulation layer is tapered from the bottom surface toward the top surface.

14. A method of manufacturing a semiconductor device package, comprising:
(a) providing an electronic component including a plurality of conductive contacts;
(b) connecting two of the conductive contacts by a first conductive wire;
(c) forming an insulation layer devoid of a filler to surround the first conductive wire, the insulation layer being in direct contact with the electronic component;
(d) removing a portion of the insulation layer and a portion of the first conductive wire to expose a portion of the first conductive wire from a top surface of the insulation layer;
(e) forming a first patterned conductive layer including a plurality of conductive pads disposed on the insulation layer, wherein one of the conductive pads electrically contacts the exposed portion of the first conductive wire;
(f) connecting two of the conductive pads of the first patterned conductive layer by a second conductive wire, wherein the first conductive wire and the second conductive wire are bonding wires; and
(g) forming a package body encapsulating the insulation layer and the electronic component, the package body encapsulating and in direct contact and the second conductive wire.

15. The method of the claim 14, wherein operation (c) further comprises:
applying an insulating material devoid of a filler to surround the first conductive wire; and
curing the insulating material to form the insulation layer.

16. The method of the claim 14, wherein a pitch of the conductive contacts of the electronic component is less than a pitch of the conductive pads of the first patterned conductive layer.

17. The method of the claim 14, further comprising:
removing a portion of the package body and a portion of the second conductive wire to expose a portion of the second conductive wire; and
forming a second patterned conductive layer including a plurality of conductive pads disposed on the package body, wherein one of the conductive pads of the second patterned conductive layer electrically contacts the exposed portion of the second conductive wire.

* * * * *